(12) United States Patent
Tomita

(10) Patent No.: US 6,759,656 B2
(45) Date of Patent: Jul. 6, 2004

(54) ELECTRON MICROSCOPE EQUIPPED WITH ELECTRON BIPRISM

(75) Inventor: Takeshi Tomita, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/966,731

(22) Filed: Sep. 27, 2001

(65) Prior Publication Data
US 2002/0084412 A1 Jul. 4, 2002

(30) Foreign Application Priority Data
Oct. 5, 2000 (JP) ....................... 2000-305796

(51) Int. Cl.⁷ ............................... G03H 5/00
(52) U.S. Cl. ..................... 250/311; 250/492.3
(58) Field of Search ..................... 250/311, 306, 250/307, 310, 550, 492.1, 492.3

(56) References Cited

U.S. PATENT DOCUMENTS

| | | | |
|---|---|---|---|
| 3,761,721 A | 9/1973 | Altshuler et al. | 250/41.3 |
| 4,532,422 A | 7/1985 | Nomura et al. | 250/306 |
| 4,935,625 A | 6/1990 | Hasegawa et al. | 250/306 |
| 4,998,788 A | 3/1991 | Osakabe et al. | 350/3.8 |
| 5,192,867 A * | 3/1993 | Osakabe et al. | 250/311 |
| 5,442,182 A * | 8/1995 | Kubo et al. | 250/396 ML |
| 5,466,548 A | 11/1995 | Matsui | 430/1 |
| 5,767,521 A | 6/1998 | Takeno et al. | 250/492.2 |

FOREIGN PATENT DOCUMENTS

JP    6283128    *   3/1993   ............ H01J/37/26

OTHER PUBLICATIONS

"Electron Holography Approaching Atomic Resolution", Hannes Lichte, *Ultramicroscopy* 20 (1986), pp. 293–304.
"Practical aspects of electron holography", David C. Joy et al., *Ultramicroscopy* 51 (1993), pp. 1–14.

* cited by examiner

Primary Examiner—John R. Lee
Assistant Examiner—Christopher M. Kalivoda
(74) Attorney, Agent, or Firm—Webb Ziesenheim Logsdon Orkin & Hanson, P.C.

(57) ABSTRACT

An electron microscope equipped with an electron biprism is provided with second and third objective lenses placed between a sample and the electron biprism such that the sample is not affected by the magnetic fields produced by the objective lenses. The magnification of a TEM image of the sample at the focal point H is controllably varied by appropriately controlling the excitations of the objective lenses. The spacing of carrier fringes is adjusted by controllably varying the voltage applied to a line electrode of the biprism.

4 Claims, 3 Drawing Sheets

ELECTRON MICROSCOPE EQUIPPED WITH ELECTRON BIPRISM

BACKGROUND OF THE INVENTION

1. Field of the Invention

The present invention relates to an electron microscope equipped with an electron biprism for obtaining information about the thickness distribution across a sample, an electric field distribution possessed by a sample, a magnetic field distribution possessed by a sample, or other similar information.

2. Description of the Related Art

In the prior art transmission electron microscope, an electron beam is directed to a sample. A sample image consisting of an electron beam transmitted through the sample is magnified by a magnetic lens and projected onto a screen, thus permitting observation of the sample.

An electron microscope equipped with an electron biprism is included in such conventional transmission electron microscopes. In this electron microscope, the electron biprism produces carrier fringes owing to interference of the electron beam not transmitted through the sample with the electron beam transmitted through the sample. The carrier fringes overlap the image of the electrons transmitted through the sample, giving rise to a hologram. The thickness distribution across the sample, an electric field distribution possessed by the sample, a magnetic field distribution possessed by the sample, or other information is obtained by observing the hologram on a screen.

FIG. 2 schematically shows a conventional electron microscope equipped with such an electron biprism. FIGS. 3(a) and 3(b) illustrate the electron biprism. FIG. 3(a) indicates the state in which the electron biprism has been turned off, and FIG. 3(b) indicates the state in which the biprism has been turned on.

In FIGS. 2 and 3(a) and 3(b), an electron microscope 1 has an electron gun 3 emitting an electron beam 2. The electron beam emitted by the electron gun 3 is accelerated by an accelerating portion 4. An illumination system 5 directs the electron beam 2 to a sample 6 after appropriately converging or diverging the beam 2. An objective lens 7 focuses a sample image originating from the electron beam transmitted through the sample 6. An electron biprism 8 is used to create a hologram. A line electrode 8a consists of a conductive wire having a diameter of about 0.3 to 0.6 $\mu$m, the wire being stretched perpendicular to the electron beam path. A voltage source 8b applies a voltage of tens to hundreds of volts, for example, to the line electrode 8a. A switch 8c is connected across the voltage source 8b. Grounding electrodes 8d and 8e extend parallel to the line electrode 8a and are located on the opposite sides of the line electrode 8a. The grounding electrodes 8d and 8e regulate the electric field produced around the line electrode 8a. A focusing system 9 includes the electron biprism 8. In this focusing system 9, a hologram created by the electron biprism 8 is magnified by plural stages of magnetic lenses 10 and focused onto a screen 11. A transmission electron image of the sample 6 is indicated by 12. The optical axis of the electron beam is indicated by O. The line electrode 8a produces a shadow S.

In the electron microscope 1 equipped with the electron biprism 8 constructed in this way, when the electron biprism has been turned off, the switch 8c is thrown to the ground side as shown in FIG. 3(a). Under this condition, the voltage of the voltage source 8b is not applied to the line electrode 8a; ground potential is applied to the line electrode 8a.

When the electron beam 2 emitted by the electron gun 3 hits the sample 6, the electron beam 2a not transmitted through the sample 6 and the electron beam 2b transmitted through the sample 6 are converged by the objective lens 7. Then, this converged beam 2 passes through the electron biprism 8 located under the objective lens 7. Since ground potential is given to the line electrode 8a, electrons 2 from the objective lens 7 are not deflected by the line electrode 8a during passage through the electron biprism 8.

Therefore, as shown in FIG. 3(a), the transmission electron image 12 of the sample 6 and the shadow S of the line electrode 8a are separated and projected onto the screen 11. At this time, the position of the sample 6 is adjusted and the angular position of the line electrode is adjusted by a rotary mechanism so that the transmission electron image of the sample 6 is formed only on one side of the shadow S of the line electrode.

On the other hand, when a hologram consisting of a TEM image of the sample 6 on which carrier fringes are superimposed is observed, the switch 8c is thrown to the side of the voltage source 8b as shown in FIG. 3(b) to turn on the electron biprism 8. Under this condition, a positive voltage from the voltage source 8b is applied to the line electrode 8a. Electron beam parts which are converged by the objective lens 7 and hit on the opposite sides of the line electrode 8a in the same way as in the foregoing process are attracted toward the center by the positive voltage from the voltage source 8b. The beam parts are made to overlap each other in a lower position, thus creating carrier fringes. These carrier fringes are made to overlap the TEM image 12, creating a hologram. The hologram is enlarged by the focusing system 9 and projected onto the screen 11. By observing this hologram, the thickness distribution across the sample 6, an electric field distribution possessed by the sample, or a magnetic field distribution possessed by the sample can be obtained as information about variations in phase of the electron beam.

The electron microscope equipped with the aforementioned electron biprism has an excellent feature that allows the user to take the distribution of electric or magnetic field possessed by the sample 6 as information about variations in phase of the electron beam 2. Where a magnetic field distribution possessed by a sample is examined, if it is a magnetic sample, then it is necessary to place the sample 6 in a space where the effects of magnetic field can be neglected.

In the above-described conventional electron microscope 1, the sample 6 is placed in a strong magnetic field set up by the objective lens 7 and so it is necessary to turn off the objective lens 7 in examining the magnetic field distribution possessed by the sample if it is magnetic in nature.

However, the objective lens 7 plays a role for forming a crossover point P of the electron beam in an appropriate position between the sample 6 and the electron biprism 8 as shown in FIGS. 3(a) and 3(b), i.e., plays a role for forming a light source P for the electron biprism 8. The objective lens 7 further serves to form a TEM image of the sample in an appropriate position behind the electron biprism 8. Therefore, if the objective lens 7 is turned off, it is difficult to appropriately set the focal points of the light source P and hologram relative to the biprism 8. In addition, it is impossible to vary the magnification of the TEM image of the sample on the hologram-focused plane.

On the other hand, the spacing of the carrier fringes can be varied by the voltage applied to the biprism line electrode 8a. If the spacing of the fringes is narrowed in order to enhance the resolution of phase information, the contrast of the carrier fringes deteriorates. As a result, the signal-to-noise ratio of the obtained phase information becomes impaired.

Accordingly, in the conventional electron microscope shown in FIG. 2, the ratio of the magnification of the TEM image of the sample in the objective image plane to the spacing of the interference fringes is required to be variable to obtain phase information at the highest signal-to-noise ratio under the desired resolution, for the following reason. If the spacing of the interference fringes is finely controlled, the image contrast can be enhanced by controlling the magnification of the TEM image of the sample in the objective image plane. However, if the objective lens 7 is turned off as mentioned previously, it is impossible to vary the magnification of the TEM image of the sample in the objective image plane.

SUMMARY OF THE INVENTION

It is an object of the present invention to provide an electron microscope equipped with an electron biprism capable of effectively extracting information about variations in phase of an electron beam and of enhancing the spatial resolution of the phase information further.

This object is achieved in accordance with the teachings of the present invention by an electron microscope equipped with an electron biprism for causing an electron beam transmitted through a space where there is no sample and an electron beam transmitted through a sample to overlap each other, thus creating carrier fringes. This microscope is characterized in that plural lenses are placed between the sample and the electron biprism.

Other objects and features of the invention will appear in the course of the description thereof, which follows.

BRIEF DESCRIPTION OF THE DRAWINGS

FIG. 3(b) is a diagram similar to FIG. 3(a), but in which the biprism has been turned on.

DESCRIPTION OF THE PREFERRED EMBODIMENTS

Figure 1:
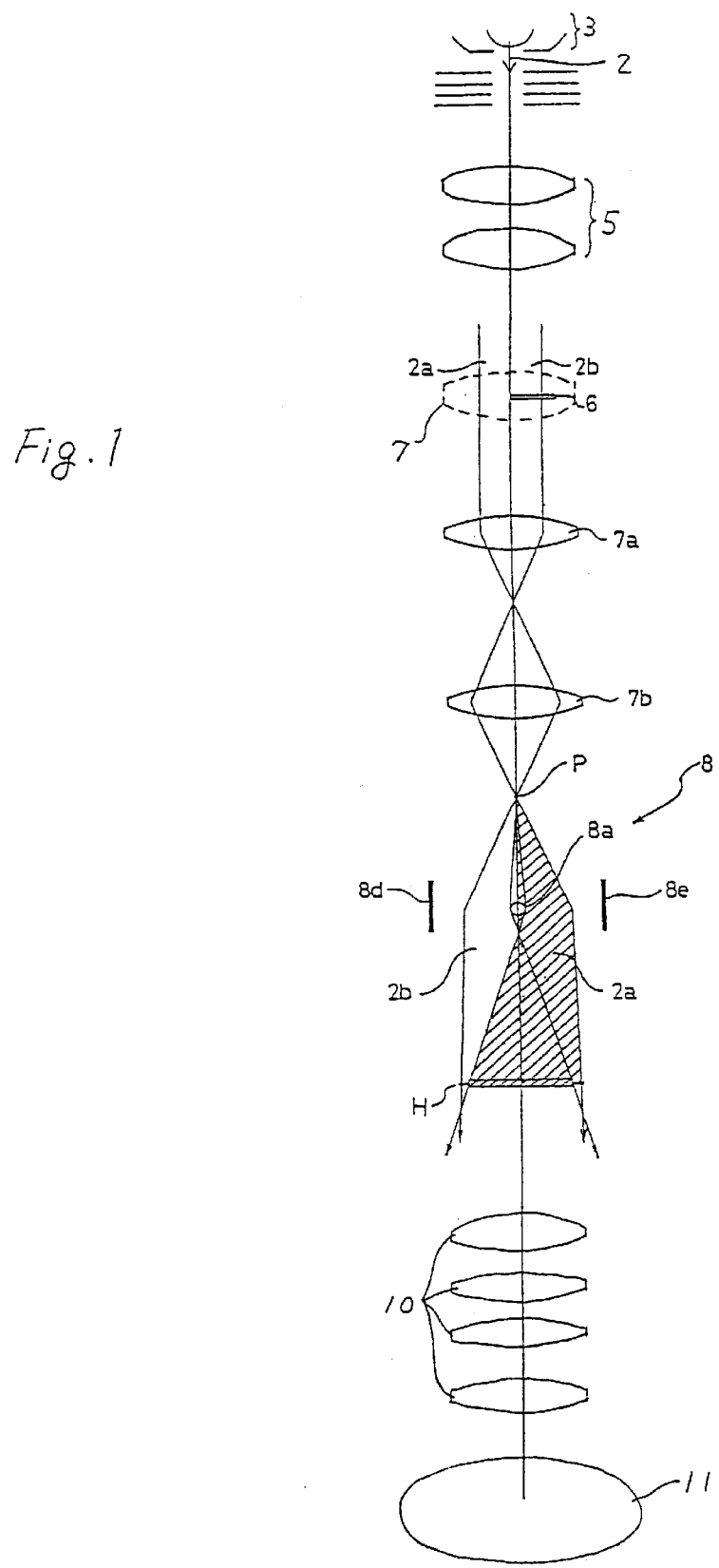
FIG. 1 is a schematic diagram of an electron microscope equipped with an electron biprism in accordance with the present invention.
Figure 2:
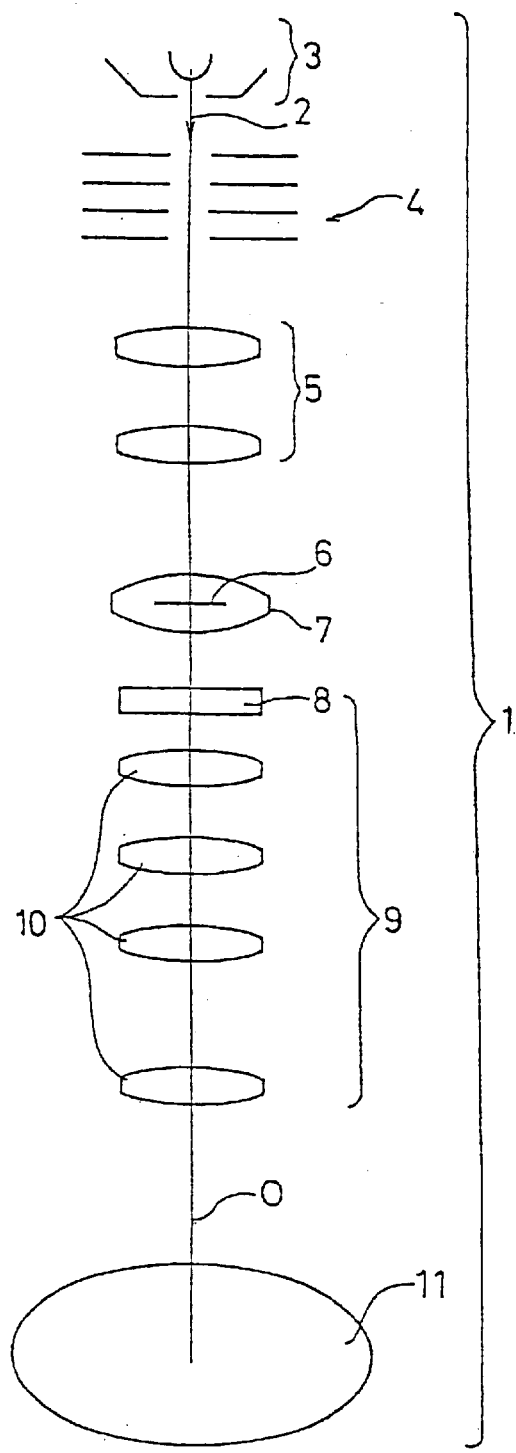
FIG. 2 is a schematic diagram of an electron microscope equipped with the prior art electron biprism.
Figure 3A:
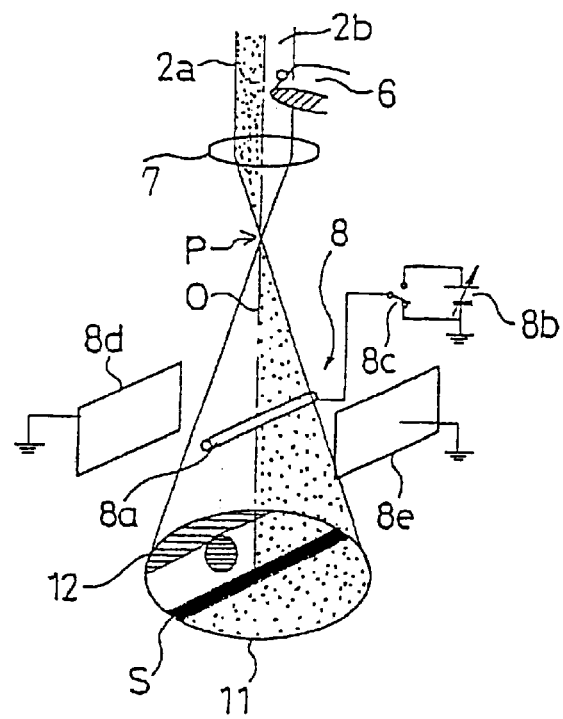
FIG. 3(a) is a diagram illustrating an electron biprism, and in which the biprism has been turned off.

Referring to FIG. 1, there is shown an electron microscope equipped with an electron biprism embodying the concept of the present invention. It is to be noted that like components are denoted by like reference numerals in various figures including FIG. 2 and FIGS. 3(a) and 3(b) already used and that those components which have been already described will not be described in detail below.

In FIG. 1, the electron microscope 1 fitted with the electron biprism 8 has the conventional objective lens (a first objective lens) 7 but this objective lens 7 is turned off when the electron biprism 8 is turned on and a hologram of a magnetic sample is obtained as described later.

Referring also to FIG. 1, a second objective lens 7a and a third objective lens 7b are added in series in the direction of the optical axis between the sample 6 and the electron biprism 8. That is, this electron microscope has three stages of objective lenses. These second and third objective lenses 7a and 7b are so placed that the sample 6 is unaffected or little affected by the magnetic fields produced by these objective lenses 7a, 7b and that the divergent point (crossover) of the electron beam relative to the electron biprism 8 is in an appropriate position relative to the biprism 8 between the third objective lens 7b and the biprism 8.

In the electron biprism 8, the electron beam 2a not transmitted through the sample 6 and the electron beam 2b transmitted through the sample 6 together form carrier fringes. The hologram is created at the position H of focusing plane by superimposition of the carrier fringes onto the TEM image of the sample. The position H is appropriately set between the biprism 8 and the set of magnetic lenses 10 of the focusing system. The magnification of the TEM image of the sample at the position H can be controllably varied by the combination of the excitation strengths of the second and third objective lenses 7a and 7b in such a way that the position where the hologram is created is fixed at the position H described above.

Figure 3B:
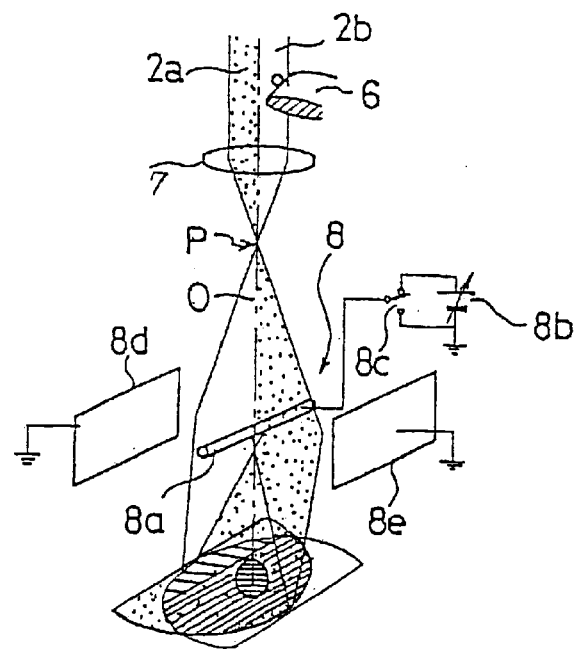

In the electron microscope constructed in this way, when a hologram is observed, the electron biprism 8 that has retracted outside the optical axis is brought to the optical axis O as shown in FIG. 1. Then, as shown in FIG. 3(b), the electron biprism 8 is turned on.

Where the sample 6 is a magnetic sample, the objective lens 7 is turned off, so that the magnetic sample is unaffected by the magnetic field produced by the objective lens 7. The amounts of excitation of the objective lenses 7a and 7b are controlled to desired amounts.

As shown in FIG. 1, the electron beam 2a not transmitted through the magnetic sample 6 and the electron beam 2b transmitted through the sample 6 are converged by the second and third objective lenses 7a and 7b. A divergent point (crossover) P is created between the third objective lens 7b and the electron biprism 8. The electron beams 2a and 2b enter the electron biprism 8.

This electron biprism 8 focuses a hologram at the position H of the focal plane, the hologram being created by superimposition of the carrier fringes onto the TEM image of the sample. At this time, the excitations of the second and third objective lenses 7a and 7b, are appropriately controlled to thereby vary the magnification of the TEM image of the sample at the position H. Also, the spacing of the carrier fringes is adjusted by varying the voltage applied to the line electrode 8a of the electron biprism 8. Consequently, the magnification of the sample TEM image and the carrier fringe spacing which conform to the purpose are obtained. The hologram is magnified by the magnifying lens system 10 and projected onto the screen 11.

In this example of electron microscope, the objective lenses 7a and 7b, are placed in positions where the magnetic sample 6 is not affected by the produced magnetic fields. Therefore, where the magnetic field distribution possessed by the magnetic sample 6 is examined, a TEM image can be formed at the position H of the focal point such that the magnetic sample 6 is not affected by the magnetic fields generated by the objective lenses 7a and 7b. This assures that the distribution of electric or magnetic field possessed by the magnetic sample 6 can be taken as information about variations in phase of the electron beam 2. Hence, the magnetic field distribution across the magnetic sample 6 can be examined more easily and accurately.

In accordance with the present invention, the magnification of the TEM image of the sample at the position H can be varied by adjusting the excitations of the second and third lenses 7a and 7b. Furthermore, the spacing of the carrier fringes can be varied by changing the voltage applied to the line electrode 8a. Since a combination of the magnification of the sample TEM image and the carrier fringe spacing which conform to the purpose is obtained, the contrast can be enhanced by controllably varying the magnification of the TEM image of the sample, even if a hologram of a magnetic sample is observed and the spacing of the carrier fringes is finely controlled. Because the ratio of the magnification of the TEM image of the sample to the spacing of the carrier fringes can be varied according to the purpose in this way, the signal-to-noise ratio of the phase information can be optimized under the desired resolution.

When a hologram of a nonmagnetic sample is observed with the microscope of FIG. 1, the objective lens 7 is also turned on. The excitations of the objective lenses 7, 7a, and 7b, are controlled to desired amounts.

Where a normal TEM image is observed with the electron microscope of FIG. 1, the electron biprism 8 is retracted off the optical axis. Then, only the objective lens 7 is turned on, for example, while the second and third objective lenses 7a and 7b are turned off. Under this condition, a TEM image is observed.

While one example of the present invention has been described thus far, the present invention is not limited thereto. Rather, the invention embraces other changes and modifications.

For example, in the above example, two stages of objective lenses 7a, 7b are placed between the sample 6 and the electron biprism 8. Three or more objective lenses may be provided in the same way as in the foregoing examples, and three or more stages of objective lenses may be mounted. This makes it possible to control the magnification of the TEM image of the sample at the focal point H more finely.

Furthermore, in the above embodiment, there is provided the conventional objective lens 7. This objective lens 7 may be omitted and only the second and third objective lenses 7a and 7b may be provided.

Having thus described my invention with the detail and particularity required by the Patent Laws, what is desired protected by Letters Patent is set forth in the following claims.

What is claimed is:

1. An electron microscope for producing a hologram of varying magnification equipped with an electron biprism for causing an electron beam passed through a space where no sample is present and an electron beam transmitted through a sample to overlap each other to thereby create carrier fringes, said electron microscope comprising:

a plurality of lenses mounted between said sample and said electron biprism; and means for controlling the combination of excitation strengths of said lenses in such a way that a position where a hologram is created is fixed, notwithstanding the selected magnification, said hologram being obtained by overlapping of said carrier fringes and a transmission electron microscope image of said sample.

2. The electron microscope of claim 1, wherein said lenses are spaced remotely from said sample such that magnetic fields produced by said lenses do not reach said sample.

3. The electron microscope of claim 1, wherein there is further provided an objective lens placed close to said sample such that a magnetic field produced by said objective lens reaches said sample, and wherein said objective lens is turned off during observation of a hologram of a magnetic sample.

4. The electron microscope of claim 1, wherein said electron biprism is constructed so as to be retractable from the optical axis of an electron beam.

* * * * *